(12) United States Patent
Wu et al.

(10) Patent No.: US 6,700,374 B1
(45) Date of Patent: Mar. 2, 2004

(54) EPI CALIBRATION METHOD TO MINIMIZE GHOSTING IN RECONSTRUCTED IMAGES

(75) Inventors: Dee H. Wu, Shaker Heights, OH (US); Wayne R. Dannels, Richmond Heights, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/537,139

(22) Filed: Mar. 29, 2000

(51) Int. Cl.$^7$ ................................................. G01V 3/00
(52) U.S. Cl. ........................ 324/312; 324/306; 324/309; 324/307
(58) Field of Search ................................ 324/309, 307, 324/312, 306, 318, 300, 303; 382/128

(56) References Cited

U.S. PATENT DOCUMENTS

| | | | | |
|---|---|---|---|---|
| 5,672,969 A | * | 9/1997 | Zhou et al. | 324/309 |
| 6,057,685 A | * | 5/2000 | Zhou | 324/306 |
| 6,188,219 B1 | * | 2/2001 | Reeder et al. | 324/307 |
| 6,249,595 B1 | * | 6/2001 | Foxall et al. | 382/128 |
| 6,275,038 B1 | * | 8/2001 | Harvey | 324/309 |

OTHER PUBLICATIONS

Maas et al., article "Post–Registration Spatial Filtering To Reduce Noise in Functional MRI Data Sets" Magnetic Resonance Imaging vol. 17 No. 9 pp. 1371–1382 1999.*
D. Kelley, et al., "Techniques for Phase Correction of Raw Data for EPI with Unshielded Gradient," *12th SMRM*, 1993, p. 1237.
Z. H. Cho, et al., "Phase Error Corrected Interlaced Echo Planar Imaging," p. 912.
G. Kashmar, et al., "A Novel Ghost Elimination Method for EPI," *4th ISRIRM*, p. 1478.
Yi–Hsuan Kao, et al., "Nyquist Ghost Elimination in Blipped Echo–planar Imaging," *4th JSRMRM*, 1996, p. 1476.
MR Evaluation of Stroke, pp. 12–13.
W. Yuh, et al., "Fibrinolytic Treatment of Acute Stroke: Are We Treating Reversible Cerebral Ischemia?", *AJNR*, 1995, pp. 1994–2000.
B. R. Rosen, et al., "Susceptibility Contrast Imaging of Cerebral Blood Volume: Human Experience," *Magnetic Resonance in Medicine*, 22, 1991, pp. 293–299.

(List continued on next page.)

*Primary Examiner*—Edward Lefkowitz
*Assistant Examiner*—Tiffany A. Fetzner
(74) *Attorney, Agent, or Firm*—Fay, Sharpe, Fagan, Minnich & McKee, LLP

(57) ABSTRACT

A method of magnetic resonance imaging is provided. It includes supporting a subject in an examination region of an MRI scanner (A), and applying an EPI pulse sequence with the MRI scanner (A) to induce a detectable magnetic resonance signal from a selected region of the subject. The magnetic resonance signal are received and demodulated to generate raw data. Applied to the raw data are a pair of ghost reducing correction factors ($\theta,\Delta$). The pair of corrections factors ($\theta,\Delta$) included a phase correction ($\theta$) and a read delay ($\Delta$). The phase correction ($\theta$) compensates for phase errors in the raw data, and the read delay ($\Delta$) effectively shifts a data acquisition window (120) under which the raw data was collected to thereby align the raw data in k-space. The correction factors affect how data is loaded into k-space to generate k-space data, and the k-space data is subjected to a reconstruction algorithm to generate image data. Thereafter, values for the pair of correction factors ($\theta,\Delta$) are derived from the image data.

24 Claims, 4 Drawing Sheets

OTHER PUBLICATIONS

D. H. Wu, et al., "On–line Time–to–peak MR Imaging Method Enables Rapid and Robust Discrimination Between Infarcted and At–risk Tissue in Clinical Stroke Patients," pp. 387–388.

E. O. Stejskal, et al., "Spin Diffusion MEasurements: Spin Echoes in the Presence of a Time–Dependent Field Gradient," *The Journal of Chemical Physics*, vol. 42, No. 1, Jan. 1, 1965, pp. 288–292.

B. R. Rosen, et al., "Perfusion Imaging with NMR Contrast Agents," *Magnetic Resonance in Medicine*, 14, 1990, pp. 249–265.

S. Ogawa, et al., "Magnetic Resonance Imaging of Blood Vessels at High Fields: In Vivo and in Vitro Measurements and Image Simulation," *Magnetic Resonance in Medicine*, 16, 1990, pp. 9–18.

R. Turner, et al., "Functional Mapping of the Human Visual Cortex at 4 and 1.5 Tesla Using Deoxygenation Contrast EPI," *MRM 29*, 1993, pp. 277–279.

P. A. Bandettini, et al., "Processing Strategies for Time–Course Data Sets in Functional MRI of the Human Brain," *MRM 30*, 1993, pp. 161–173.

M. H. Buonocore, et al., "Ghost Artifact Reduction for Echo Plnar Imaging Using Image Phase Correction," *MRM 38*, 1997, pp. 89–100.

D. L. Foxall, et al., "Rapid Iterative Reconstruction for Echo Planar Imaging," *Magnetic Resonance in Medicine*, 42, 1999, pp. 541–547.

C. B. Ahn, et al., "A New Phase Correction Method in NMR Imaging Based on Autocorrelation and Histogram Analysis," *IEEE Transactions on Medical Imaging*, vol. MI–6, No. 1, Mar. 1987, pp. 32–36.

A Jesmanowicz, et al., "Phase Correction for EPI Using Internal Reference Lines," *12th SMRM*, 1993, p. 1239.

\* cited by examiner (Prior Art) Fig. 5A

EPI CALIBRATION METHOD TO MINIMIZE GHOSTING IN RECONSTRUCTED IMAGES

BACKGROUND OF THE INVENTION

The present invention relates to the art of medical diagnostic imaging. It finds particular application in conjunction with magnetic resonance imaging (MRI) scanners, and will be described with particular reference thereto. However, it is to be appreciated that the present invention is also amenable to other like applications.

Commonly, in MRI, a substantially uniform temporally constant main magnetic field, $B_0$, is set up in an examination region in which a subject being imaged or examined is placed. Via magnetic resonance radio frequency (RF) excitation and manipulations, selected magnetic dipoles in the subject which are otherwise aligned with the main magnetic field are tipped (via RF pulses) into a plane transverse to the main magnetic field where they precess or resonate. In turn, the resonating dipoles are allowed to decay or realign with the main magnetic field while inducing detectable magnetic resonance (MR) echoes from a selected region of the subject. The various echoes making up the MRI signal are typically encoded via magnetic gradients set up in the main magnetic field. The raw data from the MRI scanner is collected into a matrix commonly known as k-space. Ultimately, in an imaging experiment, by employing Inverse Fourier or other known transformations, an image representation of the subject is reconstructed from the k-space data.

The commonly known echo planar imaging (EPI) is a rapid MRI technique which is used to produce tomographic images at high acquisition rates, typically several images per second. It has been found useful in perfusion and/or diffusion studies, for functional magnetic resonance imaging (fMRI), in dynamic-contrast studies, etc. However, images obtained in EPI experiments tend to be vulnerable to an artifact know as "ghosting" or "ghost images." The "ghosts" are typically positioned at N/2 pixels relative to the true or desired object image position (where N is the number of pixels across the image field of view (FOV)). More specifically, alternating errors or cyclic errors can be generated in the k-space data due to common system limitations or imperfections such as, e.g., imperfect gradient application, non-linear system responses (i.e., Maxwell fields, mechanical displacements or vibrations, etc.), instabilities in digital to analog conversion timing, or inherent properties of the imaged object (i.e., susceptibility differences, flow/respiratory changes, chemical shifts, etc.). The cyclic errors are typically created by differences in the odd and even horizontal data lines of k-space, e.g., misalignment of the data line peaks, or phase shift errors. These may be denoted as cyclic errors, because each full cycle of the readout gradient contains both a positive polarity portion and a negative polarity portion, and within the full cycle there is mismatch or error between the two polarity portions. The same error is largely repeated in each successive cycle. Likewise, these errors may be denoted as alternating, because each cycle produces a pair of consecutive data lines, with the odd numbered lines exhibiting substantially consistent data, the even numbered lines also being substantially consistent, but the neighboring even and odd lines exhibiting relative error or inconsistency. In any event, the Fourier reconstruction tends to convert the cyclic errors into secondary images or "ghosts" that are shifted by a half-image from the primary or true desired image of the object.

The ghost images can obscure the true desired image, reduce image clarity or sharpness, and generally degrade overall image quality. Moreover, high levels of ghosting can produce false readings that lead to diagnostic error. Accordingly, it is highly desirable to produce EPI images that are essentially free of ghost artifacts.

However, previously developed techniques for addressing ghosting in EPI experiments remain subject to certain drawbacks or limitations. For example, one popular and well know method for EPI ghost reduction is the phase reference scan which employs a reference scan with zero phase encoding prior to the imaging pulse sequence. By examining offsets in the echo between even and odd echo acquisitions, a set of phase correction values is determined. The goal of the phase reference scan technique has typically been to remove zero and first order phase differences between odd and even echoes, and has been shown capable of reducing an amount of ghosting. Still, the phase reference scan technique is known to occasionally increase the N/2 ghosting artifact. Reference scan methods may introduce error into images if there is deviation or inconsistency between the reference acquisition and the associated image acquisition, or if there are flawed results generated from the analysis of the reference image.

Another method in the prior art involves the collection of EPI raw data in which a data line or small number of data lines are replicated. Time shifts and perhaps phase shifts can then be estimated by looking at the location and phases of maximal signal in each line of the free induction decay (FID) readout. However, this technique is disadvantageous insomuch as the additional data lines disrupt the continuous readout in the phase encode direction and introduces point spread errors for signals not on resonance. Additionally, estimating phase differences between alternating data lines with only two data lines results in an inability to discern the alternating part of the signal variation from gradual linear (non-alternating) drifts which cause peak misalignment.

Moreover, many previously developed techniques are relatively complex and time intensive. Additionally, some of them require active operator intervention and/or judgment to effect ghost reduction, thereby putting demands on the operator's time and leaving open the possibility of operator error.

The present invention contemplates a new and improved technique for reducing ghosting in EPI images which overcomes the above-referenced problems and others.

SUMMARY OF THE INVENTION

In accordance with one aspect of the present invention, a method of magnetic resonance imaging includes supporting a subject in an examination region of an MRI scanner, and applying an EPI pulse sequence with the MRI scanner to induce a detectable magnetic resonance signal from a selected region of the subject. The magnetic resonance signal are received and demodulated to generate raw data. Applied to the raw data are a pair of ghost reducing correction factors. The pair of corrections factors include a phase correction and a read delay. The phase correction compensates for phase errors in the raw data, and the read delay effectively shifts a data acquisition window under which the raw data was collected to thereby align the raw data in k-space. The correction factors affect how data is loaded into k-space to generate k-space data, and the k-space data is subjected to a reconstruction algorithm to generate image data. Thereafter, values for the pair of correction factors are derived from the image data.

In accordance with another aspect of the present invention, a method of magnetic resonance imaging is provided. It includes supporting a subject in an examination region of an MRI scanner, and conducting an iterative calibration procedure. The iterative calibration procedure includes applying a calibration EPI pulse sequence with the MRI scanner to induce a detectable magnetic resonance signal from a selected region of the subject. The calibration EPI pulse sequence has phase encoding gradient pulses of a first amplitude. The magnetic resonance signal is received and demodulating to generate raw data to which is applied a pair of ghost reducing correction factors. The pair of corrections factors includes a phase correction and a read delay. The phase correction compensates for phase errors in the raw data, and the read delay effectively provides a timing shift to be applied to the raw data to thereby align the raw data in k-space. The correction factors affect how data is loaded into k-space to generate k-space data which is subjected to a reconstruction algorithm to generate image data. Values for the pair of correction factors are derived from the image data such that with each ensuing repetition of the calibration procedure the derived values are used for the pair of correction factors applied in the following repetition. Upon completion of the iterative calibration procedure, the last derived values are designated for use as the correction factors in a subsequent imaging experiment directed to the selected region of the subject.

In accordance with another aspect of the present invention, an MRI scanner includes a main magnet that generates a substantially uniform temporally constant main magnetic field through an examination region wherein an object being imaged is positioned. A magnetic gradient generator produces magnetic gradients in the main magnetic field across the examination region, and a transmission system includes an RF transmitter that drives an RF coil which is proximate to the examination region. A sequence control manipulates the magnetic gradient generator and the transmission system to produce an EPI pulse sequence. The EPI pulse sequence induces a detectable magnetic resonance signal from the object, and a reception system, which includes a receiver, receives and demodulates the magnetic resonance signal to obtain raw data which is loaded into a k-space storage device. A reconstruction processor subjects the k-space data to a reconstruction algorithm to generate images data which is loaded into an image data storage device. An output device ultimately produces human-viewable image representations of the object from the image data. In addition, an automatic ghost reducing means automatically generates from the image data, correction factors that are applied to the raw data for reducing ghosting in the image representations.

One advantage of the present invention is consistent reliable automated ghost reduction in EPI experiments including higher order corrections.

Another advantage of the present invention is improved image quality.

Yet another advantage of the present invention is reduced calibration time through the use of interpolated correction factors for ghost reduction.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
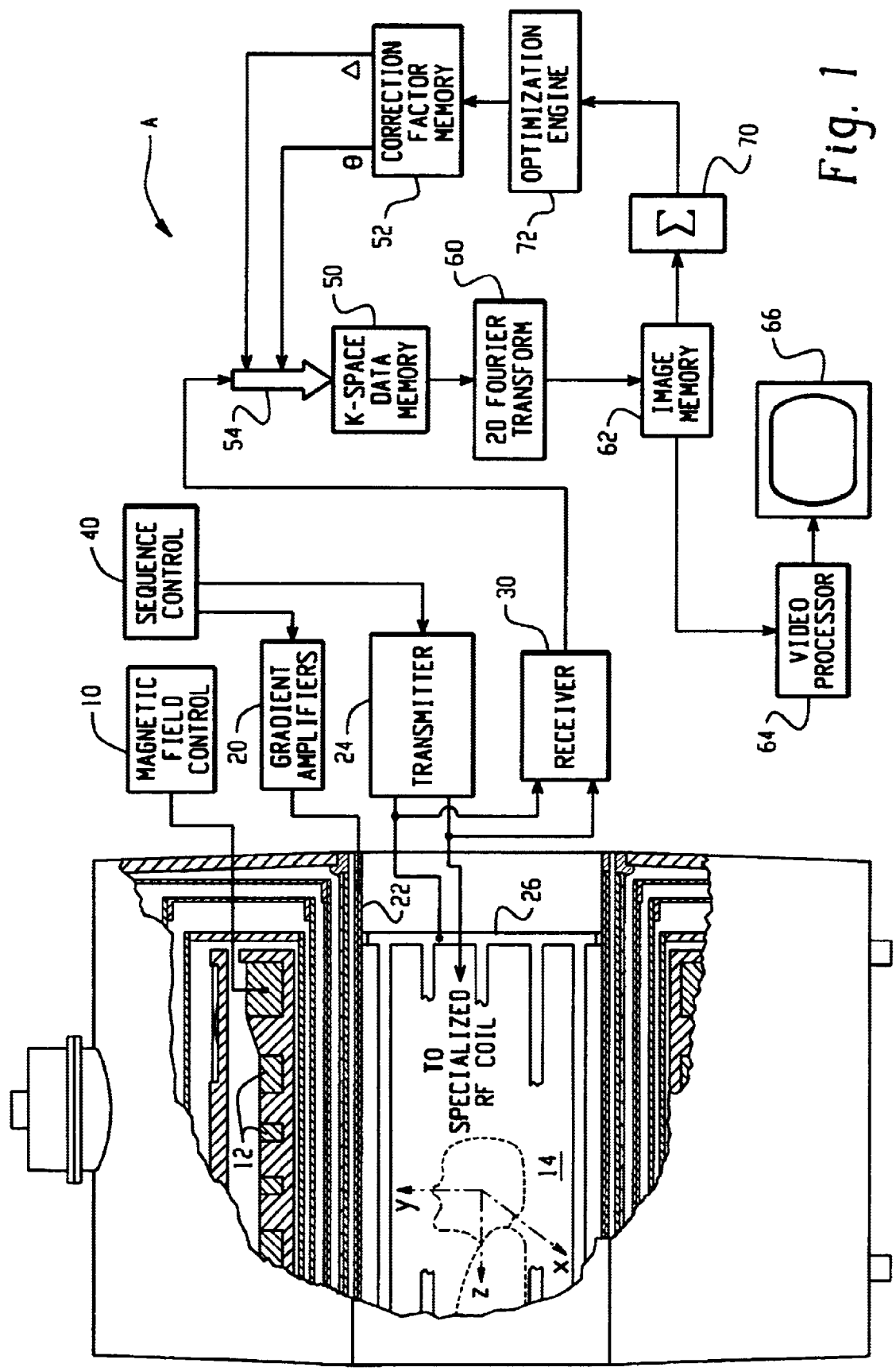
FIG. 1 is a diagrammatic illustration of a magnetic resonance imaging scanner including automated ghost reduction in accordance with aspects of the present invention.

With reference to FIG. 1, an MRI scanner A includes a main magnetic field control 10 that controls superconducting or resistive magnets 12 such that a substantially uniform, temporally constant main magnetic field $B_0$ is created along a z-axis through an examination region 14. An imaging experiment is conducted by executing a magnetic resonance sequence with the subject being imaged or examined (e.g., patient, phantom, or otherwise) placed at least partially within the examination region 14. The magnetic resonance sequence entails a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to a whole body gradient coil assembly 22 to create magnetic field gradients along x, y and z-axes of the examination region 14. An RF transmitter 24, optionally digital, applies RF pulses or pulse packets to a whole-body RF coil 26 to transmit RF pulses into the examination region. A typical RF pulse is composed of a packet of immediately contiguous pulse segments of short duration which taken together with each other and any applied gradients achieve a selected magnetic resonance manipulation.

The RF pulses are used to saturate, excite resonance, invert magnetization, refocus resonance, or manipulate resonance in selected portions of the examination region. For whole-body applications, the resulting resonance signals, generated as a result of a selected manipulation, are also commonly picked up by the whole-body RF coil 26. Alternately, for generating RF pulses in limited regions of the subject, local RF coils are commonly placed contiguous to the selected region. For example, as is known in the art, an insertable head coil (not shown) may be inserted surrounding a selected brain region at the isocenter of the bore, a selected surface coil (not shown) may be employed, or other such specialized RF coils may be employed. In addition to generating RF pulses, optionally, the local RF coil also receives magnetic resonance signals emanating from the selected region. In still other embodiments or applications, the whole-body RF coil 26 generates the RF pulses while the local RF coil receives the resulting magnetic resonance signals or vice versa.

Regardless of the RF coil configuration, the resultant RF magnetic resonance signals are picked up by one or another of the RF coils employed and demodulated by a receiver 30. Preferably, a sequence control circuit 40 controls the gradient pulse amplifiers 20 and the RF transmitter 24 to produce an MRI pulse sequence that generates magnetic resonance (MR) signals or echoes received and sampled by the receiver 30.

Figure 2A:
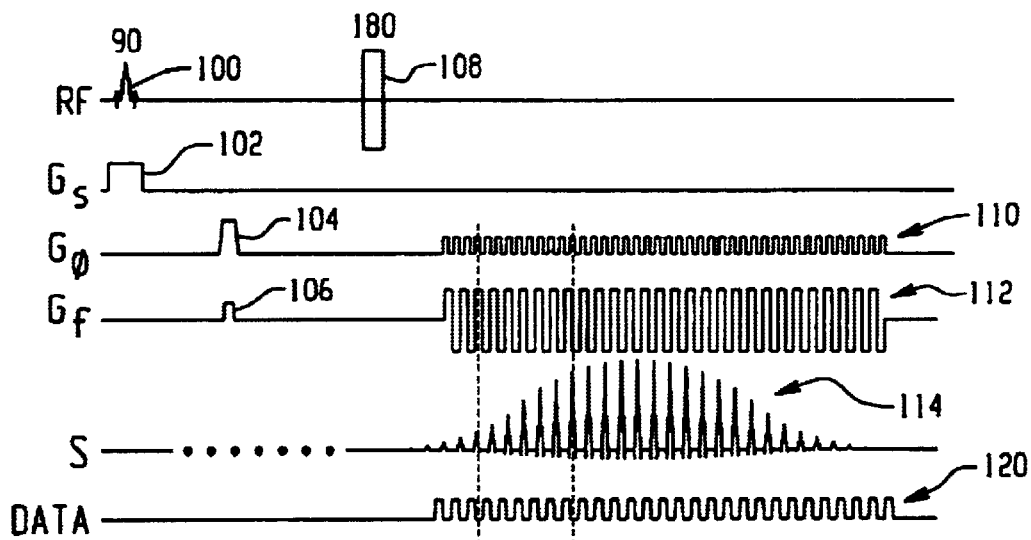
FIG. 2A is a diagrammatic illustration of an EPI pulse sequences produced in accordance with aspects of the present invention.

In a preferred embodiment, the MRI scanner runs echo planar imaging (EPI) experiments and data is sampled into a raw data time representation, then into a k-space representation accordingly, in the usual manner. More specifically, this is described by way of the example sequence depicted in FIGS. 2A and 2B, i.e., a timing diagram for an EPI sequence. EPI is a rapid MRI technique which is used to produce tomographic images, e.g., at video rates, in perfusion and/or diffusion studies, for functional magnetic resonance imaging (fMRI), etc. Preferably, the technique records an entire image in a single TR period, where TR represents the repeat time for the EPI sequence, or in the multislice variant, several temporally interleaved slices of a multislice set are acquired in a single period.

The EPI sequence begins with a 90° flip-angle slice selective RF pulse 100 which is applied in conjunction with a slice selection gradient pulse 102. The RF pulse 100 is applied via the RF coil 26 or another specialized RF coil and the gradient pulse 102 is applied via the gradient coil assembly 22, preferably, in the z-direction. There is an initial phase encoding gradient pulse 104 and an initial frequency encoding gradient pulse 106 that position resulting spins at the corner of k-space. The gradient pulses 104 and 106 are applied via the gradient coil assembly 22, orthogonal to one another and the gradient pulse 102, e.g., in the x- and y-directions, respectively. Next there is a 180° flip-angle RF pulse 108. Since, in this example, each TR of the echo planar sequence is a single slice sequence, the 180° flip-angle RF pulse 108 is not a slice selective pulse.

Figure 2B:
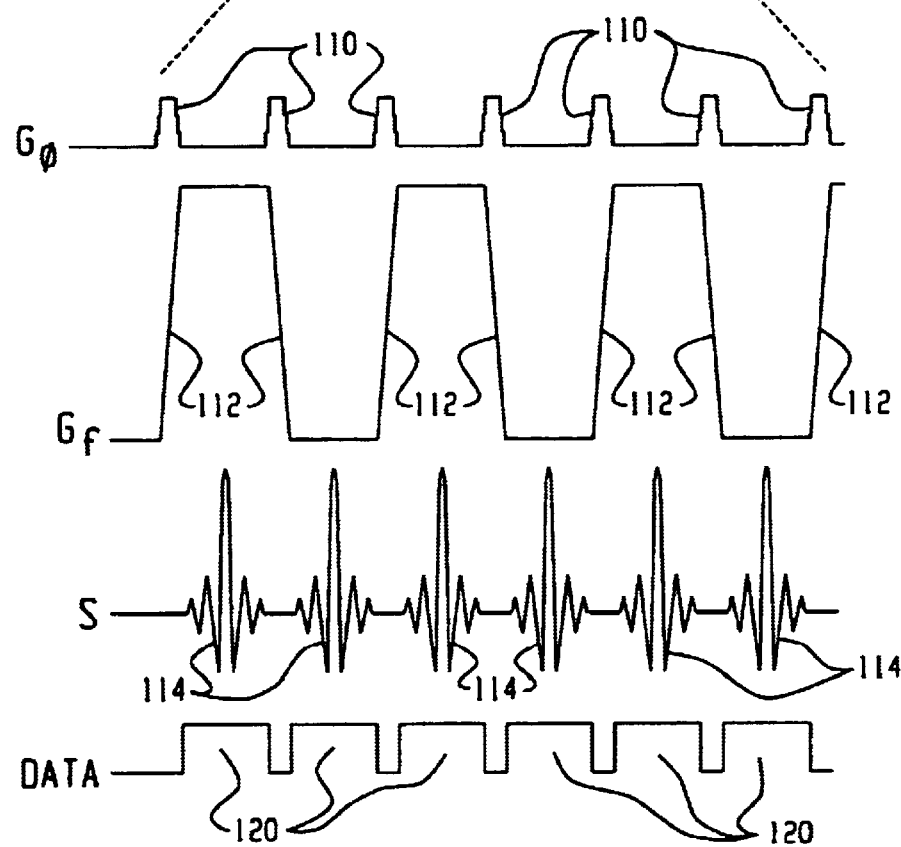
FIG. 2B is a magnified portion of the EPI pulse sequence shown in FIG. 2A.

The phase and frequency encoding directions are next cycled so as to traverse k-space, for example, by applying 128 or 256 phase and frequency encoding gradient pulses 110 and 112, respectively, in the period when the echo is recorded. With particular reference to FIG. 2B, this region of the timing diagram is examined more closely. There is shown a phase encoding gradient pulse 110, followed by a frequency encoding gradient pulse 112, during which time a signal 114 is recorded under a data acquisition window 120. Next, there is another phase encoding gradient pulse 110, followed by a reverse polarity frequency encoding gradient pulse 112, during which time the next signal 114 is recorded under the data acquisition window 120. The pattern continues until the sequence is completed with each collected signal 114 corresponding to a horizontal data line in k-space.

Figure 3:
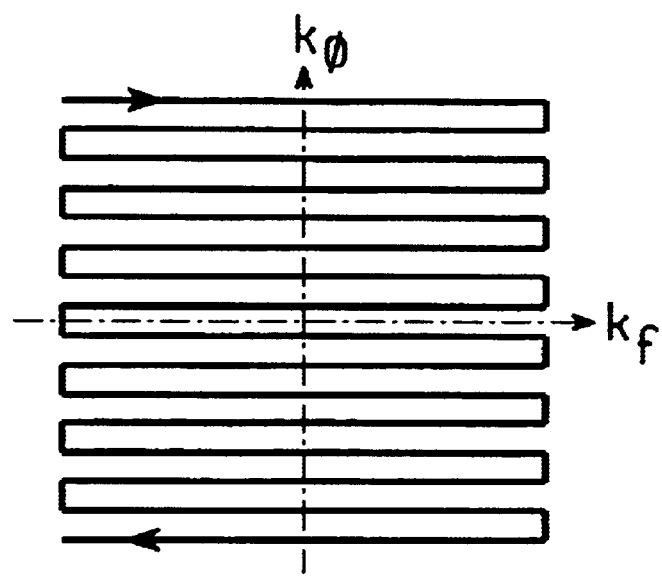
FIG. 3 is a diagrammatic illustration showing the trajectory of k-space data as it is collected into a k-space matrix using an EPI sequence in accordance with aspects of the present invention.

The raw data collected by the receiver 30 is loaded or sampled into k-space in serpentine fashion (i.e., from left to right, then right to left, then again from left to right, etc.) as shown in FIG. 3. Preferably, the k-space data is stored in a memory 50 (as shown in FIG. 1) or other similar storage device As it is being load into the k-space memory 50, the data is rebinned or transformed to fit the otherwise smoothly collected raw data into the rectilinear constraints of the k-space matrix or grid. Preferably, at a processing step 54, a pair of corrections factors from a memory 52, or other similar storage device, are applied during the transformation prior to rebinning. The pair of correction factors include: (1) a phase correction ($\theta$) that compensates for phase errors between odd data lines (i.e., the data lines collected from left to right) and even data lines (i.e., the data lines collected from right to left) in k-space, and (2) a read delay or alignment correction ($\Delta$) which shifts the data acquisition window 120 thereby effectively aligning the centers of collected signals 114 in k-space.

In one embodiment, the phase correction is a constant applied to each horizontal row of k-space. However, its sign is alternated from row to row. Thus if the correction value were an angle ($\theta$), each raw data value being transferred to the first row of the k-space matrix is rotated as a complex numerical value by a positive angle ($\theta$). Each raw data value being transferred to the next row is also given a complex rotation (i.e., a phase correction), but by a negative angle ($-\theta$). This continues with subsequent rows receiving subsequently alternating positive and negative angle corrections.

In yet another embodiment, the phase correction may be multiplication by a phase factor of alternative polarity, row by row, but with the value of the phase factor tapering down to zero at the extreme ends of each horizontal row. This embodiment may have special utility when the readout gradient has a continuous smooth varying amplitude, such as a sinusoidal waveform, and when sampling is continued throughout the entire duration of the cycle. It may be anticipated that the physical sources of phase error in the data are induced by sources which are themselves continuously varying like the oscillating readout gradient, and thus the induced error is likely to also be continuously varying. That is to say, there is no reason to expect an abrupt or instantaneous reversal of the phase error in the data. Thus a smooth tapered transition to the phase correction is likely to better compensate for the error. These tapers across each row of k-space are optionally measured and chosen based upon some empirical measurement process. Alternately, the taper may also be simply chosen to match the smoothly varying shape of the gradient waveform itself, i.e., a sinusoid in this example. Thus the phase correction may be sinusoidally varying with peak phase ($\theta$) applied at or near the center of even numbered echoes, negative phase ($-\theta$) applied at or near the center of odd numbered echoes, and zero correction applied near the extreme left hand edges and/or right hand edges of k-space.

Ultimately, in the actual imaging experiment, a reconstruction processor 60, acting on the k-space data from the memory 50, reconstructs an image representation of the subject by applying a two-dimensional (2D) Fourier transform or other appropriate reconstruction algorithm. The resulting image is a matrix or 2D pixel array of complex intensity values, the magnitudes of which represent or visualize a planar slice or slab through the subject. The image is then stored in an image memory 62 where it may be accessed by a video processor 64 that prepares and/or formats the reconstructed image for display on a video monitor 66 or other such output device that provides a human-readable depiction or rendering of the resultant image.

In a preferred embodiment, generation of the correction factors is carried out in an iterative calibration procedure or experiment conducted prior to the actual imaging experiment. The calibration procedure employs an EPI sequence essentially the same as the actual imaging experiment. With each iteration, an EPI sequence is run and a set of image data is loaded into the image memory 62. For the first iteration, the correction factors in memory 52 are set to, or selected as, a first best estimate. This first best estimate for each correction factor is optionally zero, the most recent or last estimated value, some other reasonably predicted value based on historical data or results, or is determined by other like criteria.

Once the image data has been generated and loaded into the image memory 62, the image is evaluated. That is to say, a qualitative and/or quantitative analysis is done to determine the degree of ghosting present in the image. In a preferred embodiment, this is achieved by a summing circuit or processor 70 which sums the magnitudes of all the pixels in the 2D array or matrix of image data. The sum represents a numeric cost function that provides a measure of ghosting or image sharpness. By optimizing (minimizing) the sum, minimum ghosting is realized, or in other words, image sharpness is maximized. Alternately, other known image evaluation techniques may be employed for determining the degree or level of ghosting present.

In a preferred embodiment, using the value from the summing processor 70 as the cost functional, an optimization engine 72 performs a non-linear mathematical optimization to generate the next best estimate for the correction factors. Once generated, the new correction factors are loaded and stored in the correction factor memory 52 for use in the next iteration of the calibration procedure. Preferably, the optimization engine 72 employs a Nelder-Mead optimization technique. See, e.g., a description of the Nelder-Mead algorithm in "Numerical Recipes in C" by Press, Flannery, Teukolsky, and Vetterling, 1988, Cambridge University Press, incorporated herein by reference. Alternately, other known non-linear mathematical optimization techniques may be substituted.

With each calibration, 20 to 40 iterations can be carried out. However, preferably, there is no set number of iterations. Rather, the calibration procedure continues iteratively in the manner described until the difference between an immediately preceding pair of correction factors and a current pair of corrections factors falls within a predetermined or otherwise selected tolerance. Alternately, the calibration procedure continues iteratively in the manner described until the difference between an immediately preceding value of the cost function and a current value of the cost function falls within a predetermined or otherwise selected tolerance. In either case, when the difference is within tolerance, the current pair of correction factors are designated for use in the actual imaging experiment for the corresponding slice or slab under consideration. In this manner, the correction factors are spontaneously generated and ghosting automatically eliminated or substantially reduced.

Figure 4:
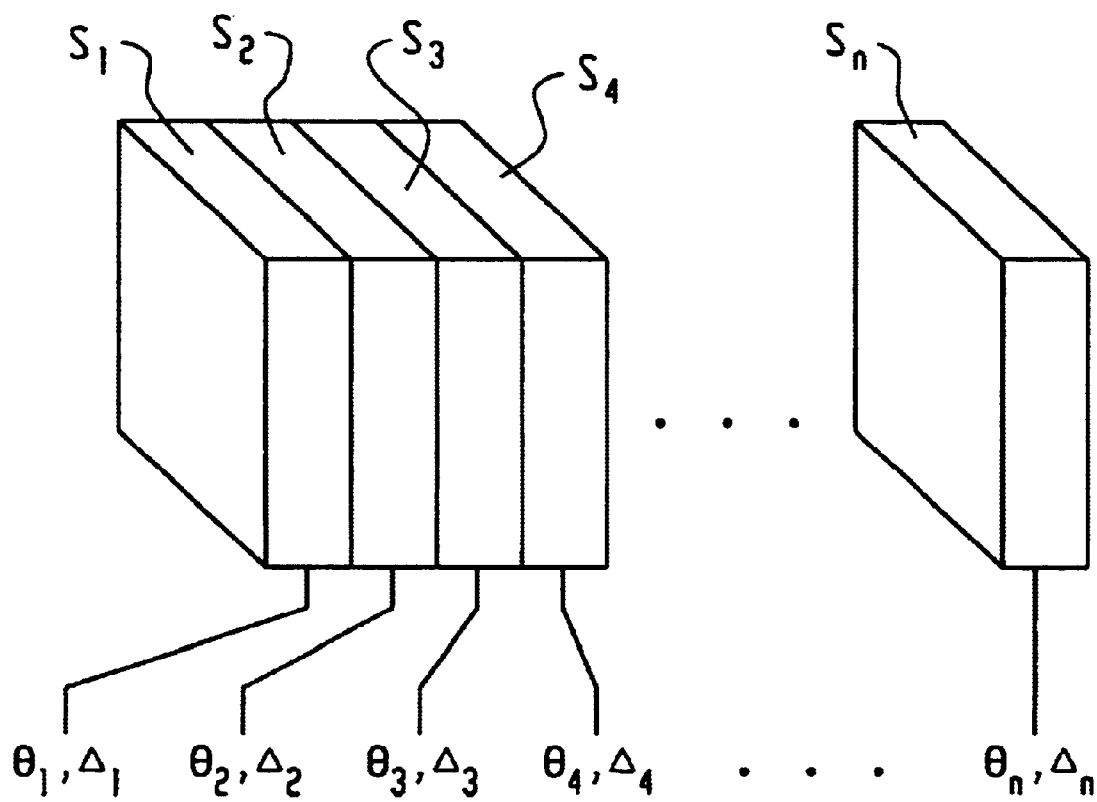
FIG. 4 is a diagrammatic illustration showing a series of image slices obtained in accordance with aspects of the present invention.

With further reference to FIG. 4, in a preferred embodiment, the actual imaging experiment optionally involves obtaining multiple images. For example, in a three dimensional (3D) volume imaging embodiment, multiple EPI sequences are run, with each run resulting in one of a series of consecutive parallel planar slices or slabs $S_1$–$S_n$ which are spatially adjacent to one another. Alternately, multiple temporally resolved images are obtained of the same slice or slab in a cine imaging experiment using an EPI sequence to acquire each consecutive frame. Accordingly, for these types of imaging experiments, the k-space and image memories 50 and 62, respectively, are 3D memories in which the corresponding data from multiple slices or slabs are accommodated. In addition, optionally, each slice $S_1$–$S_n$ has a separate pair of corresponding correction factors $(\theta_1, \Delta_1)$–$(\theta_n, \Delta_n)$ generated therefor during the calibration procedure. Preferably, however, in order to conserve time in the calibration procedure, only a subset of the pairs of calibration factors are experimentally generated during calibration. For example, m of the n pairs of correction factors are experimentally generated using the iterative calibration procedure set forth herein, where m is greater than 1 but less than n. Then, based upon the corresponding slices' relative position in the series of multiple slices, those pairs of correction factors not experimentally generated are interpolated from the subset of experimentally generated pairs using a smoothly varying curve fit thereto.

Figure 5B:
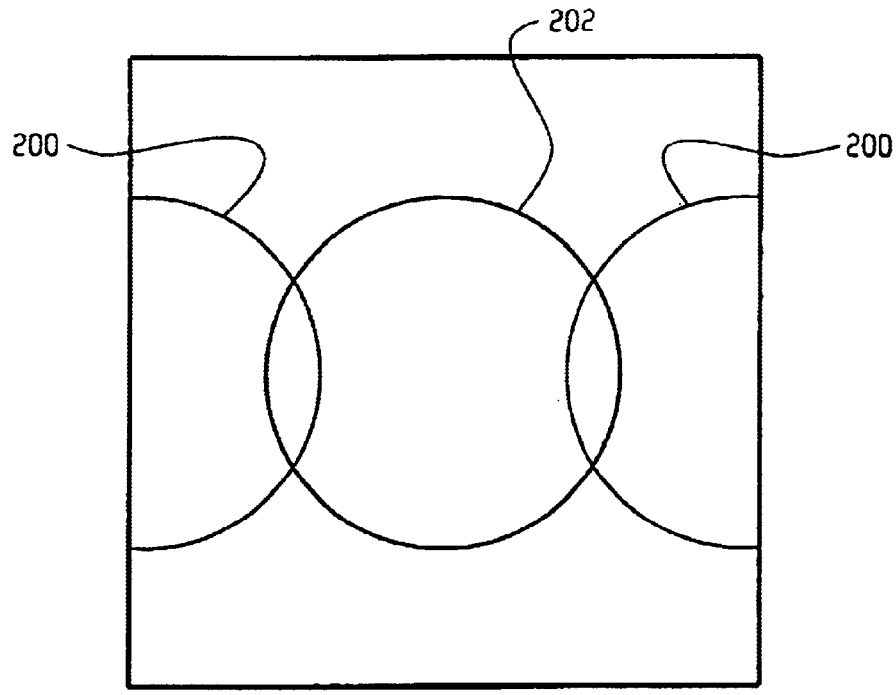
FIG. 5A is a diagrammatic illustration of an imaging experiment FOV showing a primary object image and associated overlapping potential ghosts; and, FIG. 5B is a diagrammatic illustration of a calibration experiment FOV showing a primary object image and associated non-overlapping potential ghosts in accordance with aspects of the present invention.
Figure 5B:
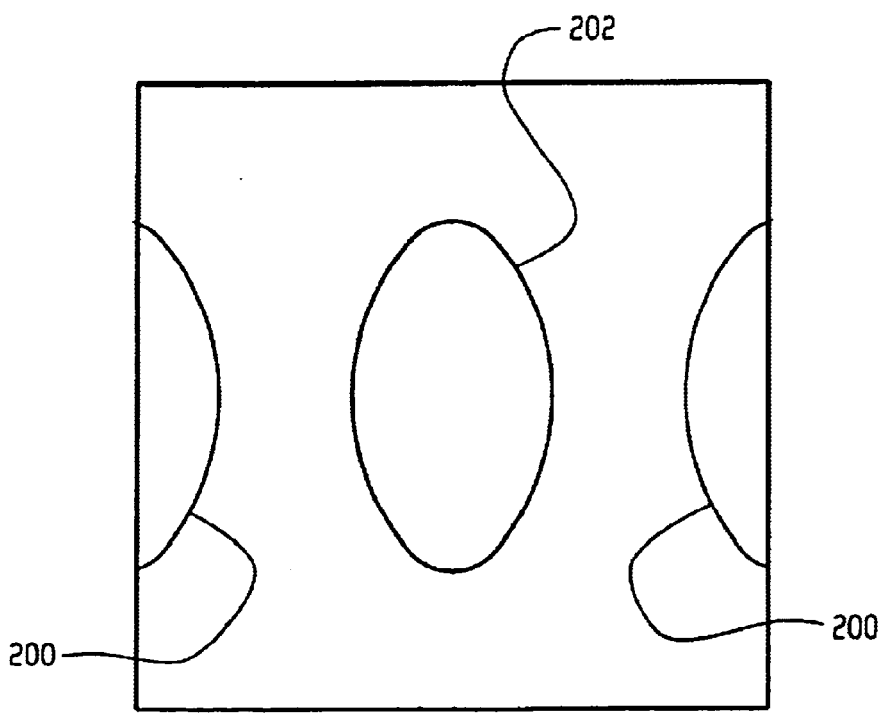

With further reference to FIGS. 5A and 5B, in a preferred embodiment, the phase encoding gradient pulse employed during the calibration procedure is reduced in amplitude relative to the phase encoding gradient pulse employed during the actual imaging experiment. In this manner, the horizontal field of view (FOV) is increased in the calibration procedure relative to the imaging experiment. In particular, FIG. 5A shows the image otherwise obtained without ghosting compensation in the smaller imaging experiment FOV. As can be seen in FIG. 5A, the FOV is such that an N/2 ghost 200 undesirably overlaps the true image of the subject 202. With particular reference to the image of FIG. 5B, by increasing the FOV in the calibration procedure, the same N/2 ghost 200 is made to fall outside the true image of the subject 202. Accordingly, the calibration procedure enjoys improved performance over the case where the N/2 ghost 200 overlaps the true image of the subject 202. Preferably, the phase encoding gradient for the calibration procedure is reduced relative to the phase encoding gradient for the imaging experiment such that the relative FOV is doubled.

In a preferred embodiment, during repeated or continuous imaging experiments (e.g., cine imaging, fMRI, etc.), the value of the cost functional (i.e., the sum of magnitudes in the image memory 62) is continually or periodically evaluated and/or monitored. Substantial changes thereto (e.g., changes greater than some predetermined or otherwise select amount) indicates one or more changed experimental conditions warranting re-calibration, such as, significant subject motion or the like.

In another preferred embodiment, one or several slice positions may be acquired in a temporal series of images. When doing so, it is possible to generate calibration factors directly or experimentally via the iterative optimization only for select images within a given time series. For all other images in the time series it is possible to use calibration factors which are interpolated from the nearby time series images for which optimized values have been determined experimentally. This may have the advantage of reducing computational load. This embodiment may further have the advantage of producing a series of images where the image quality variations are of a smooth or continuous nature in the time series, and these smooth temporal fluctuations will not interfere with the perception of more rapidly varying temporal phenomena to be observed in the subject.

Of course, in addition to the automatic ghosting compensation described herein, phase reference scans (i.e., with zero phase encoding) can also be run and the generated data therefrom stored. Accordingly, post-processing ghost corrections may be made in the usual way using the phase reference scans in those instance where desired, e.g., where there was a relatively low signal, for double checking or verifying results, etc.

Although a bore-type magnet is illustrated in FIG. 1, it is to be appreciated that the present invention is equally applicable to open magnet systems and other known types of MRI scanners.

Moreover, it is to be appreciated that the read delay, as described herein, need not entail changes to the hardware timing of waveforms or devices, such as, generating gradients or sampling demodulated MR signals into raw data. Instead, it is sufficient, and often more convenient, to incorporate time delays (or advances) into data processing steps subsequent to acquisition of the raw data. For example, consider an EPI pulse sequence which is designed such that the data acquired at a given time into the acquisition window (e.g., 500 microseconds from commencement of sampling) is intended to correspond to a k-space location, such as, e.g., a gradient echo location at Kx=0. Likewise, a data point collected at time 504 microseconds maybe be intended to correspond to a location Kx=1.0, etc. Further assume that analysis of images or some other insight indicates that image quality and ghosting, if reconstructed with no time shifts or delays, corresponds to what would be expected from data where sampling had been performed erroneously late, e.g., by an amount corresponding to say, 0.8 microseconds, or 0.20 units in k-space. Then, rather than re-acquiring data with altered and recalibrated timing, it is sufficient to re-assign how the raw data is registered into the k-space memory. In this example, we may take the raw data from time 500 microseconds, and now associate it with a shifted time, i.e., 500.8 microseconds. This in turn can be used to map the data to the k-space location, Kx=0.20. The data collected at time 504 microseconds will similarly be reassigned a shifted time, i.e., 504.8 microseconds, and a shifted k-space location, i.e., Kx=1.20, etc. Placing the raw data with such a time shift correction into the k-space array may entail interpolation or some form of rebinning or resampling, yet this is not of significant consequence, since in practice, interpolation or rebinning will be performed anyways, independent of the need to provide for these time shifts or read delays.

It is further to be appreciated that read delays or time shifts as described may correspond either to delays or advances of data. Herein, use of the term "delay" and associating a numerical value with it, implies the time shift and the correction involved may be either a delay or an advance, depending upon the sign of the numerical value. It is intended throughout that the term "delay" be interpreted to include the case of an "advance", should the delay be a negative numerical quantity.

It is further to be appreciated that read shifts or time delays as described herein need not correspond to simple numerical corrections by constants or linear functions. As is known, shifts or misregistration of data in k-space, by constant distances in k-space, have an effect on the reconstructed image of a additional phase factor which is linearly dependent upon position. Throughout this invention, the shifts here may be performed as constant shifts of the raw data. If constant amplitude readout gradients are applied, then during that constant amplitude, a uniform shift in time will correspond to a uniform shift in k-space. However, if time shifts are imposed to the data during for example a sinusoidally modulated portion of gradient, then the uniform time delay will induce varying shifts in the k-space location attributed to each data point. The resulting affect on the image is no longer described by the effects of simple linear phase factors applied to various contributions to the image. In a preferred embodiment of this invention, a correction factor as represented by a single time shift value can produce varying shifts in k-space, especially in the event of amplitude variations during a readout portion of substantially a single polarity (i.e., one horizontal line of k-space).

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging comprising:
   (a) applying an EPI pulse sequence with an MRI scanner to induce a detectable magnetic resonance signal from a selected region of a subject positioned in the MRI scanner;
   (b) receiving and demodulating the magnetic resonance signal to generate raw data;
   (c) applying a pair of ghost reducing correction factors to the raw data, said pair of corrections factors including a phase correction factor and a data alignment correction factor, wherein the phase correction factor compensates for phase errors in the raw data and the data alignment correction factor effectively shifts a data acquisition window under which the raw data was collected to thereby align the raw data with respect to itself in k-space;
   (d) loading the correction factor affected data into k-space to generate a k-space data matrix;
   (e) subjecting the k-space data matrix to an algorithm to reconstruct actual image data therefrom; and,
   (f) calculating values for the pair of correction factors using the reconstructed actual image data from step (e).

2. The method according to claim 1, wherein steps (a) through (f) make up an iterative calibration procedure, such that with each ensuing repetition, the calculated values from step (f) are used for the pair of correction factors applied in the step (c) that follows.

3. A method of magnetic resonance imaging comprising:
   (a) applying an EPI pulse sequence with an MRI scanner to induce a detectable magnetic resonance signal from a selected region of a subject positioned in the MRI scanner;
   (b) receiving and demodulating the magnetic resonance signal to generate raw data;
   (c) applying a pair of ghost reducing correction factors to the raw data, said pair of corrections factors including a phase correction and an alignment correction, wherein the phase correction compensates for phase errors in the raw data and the alignment correction effectively shifts a data acquisition window under which the raw data is collected to thereby adjust an alignment of the raw data in k-space;
   (d) loading the correction factor affected data into k-space to generate a k-space data matrix;
   (e) subjecting the k-space data matrix to a reconstruction algorithm to generate image data; and,
   (f) calculating values for the pair of correction factors from the image data, including:
      evaluating the image data to obtain a measurement of an amount of ghosting present in the image data; and,
      employing the measurement of the amount of ghosting as a cost function in an optimization algorithm which generates the values for the pair of correction factors.

4. The method according to claim 3, wherein steps (c) through (f) make up an iterative calibration procedure, such that with each ensuing repetition, the derived values from step (f) are used for the pair of correction factors applied in the step (c) that follows.

5. The method according to claim 4, wherein the iterative calibration procedure is repeated until a change in successive calculated values for the pair of correction factors is within a determined tolerance.

6. The method according to claim 4, wherein the iterative calibration procedure is repeated until a change in the cost function is within a determined tolerance.

7. The method according to claim 3, wherein said image data represents an array of pixels having complex intensity values with corresponding magnitudes, and the step of evaluating the image data comprises summing the magnitudes.

8. The method according to claim 3, wherein the optimization algorithm is a nonlinear mathematical optimization.

9. The method according to claim 3, wherein the optimization algorithm is a Nelder-Mead optimization.

10. The method according to claim 3, wherein the cost function is monitored as an indication of changed experimental conditions warranting re-calibration.

11. A method of magnetic resonance imaging comprising:
(a) supporting a subject in an examination region of an MRI scanner;
(b) conducting an iterative calibration procedure, said iterative calibration procedure comprising:
  (i) applying a calibration EPI pulse sequence with the MRI scanner to induce a detectable magnetic resonance signal from a selected region of the subject, said calibration EPI pulse sequence having phase encoding gradient pulses of a first amplitude;
  (ii) receiving and demodulating the magnetic resonance signal to generate raw data;
  (iii) applying a pair of ghost reducing correction factors to the raw data, said pair of corrections factors including a phase correction and an alignment correction, wherein the phase correction compensates for phase errors in the raw data and the alignment correction effectively shifts a data acquisition window under which the raw data was collected to thereby align the raw data with respect to itself in k-space;
  (iv) loading the correction factor affected data into k-space to generate a k-space data matrix;
  (v) subjecting the k-space data matrix to a reconstruction algorithm to generate actual image data; and,
  (vi) calculating values for the pair of correction factors from the actual image data such that with each ensuing repetition of the calibration procedure the calculated values are used for the pair of correction factors applied in the step (iii) that follows; and,
(c) upon completion of the iterative calibration procedure, designating the last calculated values for use as the correction factors in a subsequent imaging experiment directed to the selected region of the subject.

12. The method according to claim 11, wherein the imaging experiment comprises:
applying an image acquisition EPI pulse sequence with the MRI scanner to induce a detectable magnetic resonance signal from the selected region of the subject said image acquisition EPI pulse sequence having phase encoding gradient pulses of a second amplitude;
receiving and demodulating the magnetic resonance signal to generate raw data;
applying the pair of ghost reducing correction factors to the raw data using the designated values;
loading the correction factor affected data into k-space to generate a k-space data matrix;
subjecting the k-space data matrix to a reconstruction algorithm to generate image data; and,
generating from the image data a ghost reduced human-viewable image representation of the selected region of the subject.

13. The method according to claim 12, wherein the first amplitude is different than the second amplitude.

14. The method according to claim 13, wherein the first amplitude is less than the second amplitude thereby increasing a field of view during the calibration procedure relative to a field of view during the imaging experiment.

15. The method according to claim 11, wherein the calibration procedure is conducted a series of times such that designated values for pairs of correction factors are experimentally obtained for a number of corresponding selected regions of the subject, said number of corresponding selected regions of the subject being taken from a series of selected regions.

16. The method according to claim 15, wherein the number of corresponding selected regions of the subject includes all the selected regions in the series thereof.

17. A method of magnetic resonance imaging comprising:
(a) supporting a subject in an examination region of an MRI scanner;
(b) conducting an iterative calibration procedure, said iterative calibration procedure comprising:
  (i) applying a calibration EPI pulse sequence with the MRI scanner to induce a detectable magnetic resonance signal from a selected region of the subject, said calibration EPI pulse sequence having phase encoding gradient pulses of a first amplitude;
  (ii) receiving and demodulating the magnetic resonance signal to generate raw data;
  (iii) applying a pair of ghost reducing correction factors to the raw data, said pair of corrections factors including a phase correction factor and a data alignment correction factor, wherein the phase correction factor compensates for phase errors in the raw data and the data alignment correction factor effectively shifts a data acquisition window under which the raw data was collected to thereby align the raw data with respect to itself in k-space;
  (iv) loading the correction factor affected data into k-space to generate a k-space data matrix;
  (v) subjecting the k-space data matrix to a reconstruction algorithm to generate actual image data; and,
  (vi) calculating values for the pair of correction factors from the actual image data such that with each ensuing repetition of the calibration procedure the calculated values are used for the pair of correction factors applied in the step (iii) that follows;
(c) upon completion of the iterative calibration procedure, designating the last calculated values for use as the correction factors in a subsequent imaging experiment directed to the selected region of the subject; and,
(d) conducting the calibration procedure a series of times such that designated values for pairs of correction factors are experimentally obtained for a number of corresponding selected regions of the subject, said number of corresponding selected regions of the subject being taken from a series of selected regions, wherein the number of corresponding selected regions of the subject includes less than all the selected regions in the series thereof.

18. The method according to claim 17, wherein for those selected regions in the series thereof that do not experimentally obtain designated values for their pairs of correction factors, designated values for their correction factors are obtained via an interpolation from the experimentally obtained designated values.

19. The method according to claim 18, wherein the interpolation is carried out along a smoothly varying curve fit to the experimentally obtained designated values.

20. An MRI scanner comprising:
a main magnet that generates a substantially uniform temporally constant main magnetic field through an examination region wherein an object being imaged is positioned;
a magnetic gradient generator that produces magnetic gradients in the main magnetic field across the examination region;
a transmission system which includes an RF transmitter that drives an RF coil which is proximate to the examination region;
a sequence control which manipulates the magnetic gradient generator and the transmission system to produce an EPI pulse sequence, said EPI pulse sequence inducing a detectable magnetic resonance signal from the object;
a reception system which includes a receiver that receives and demodulates the magnetic resonance signal to obtain raw data;
a k-space storage device into which the raw data is loaded as a k-space data matrix;
a reconstruction processor that subjects the k-space data matrix to a reconstruction algorithm to generate image data which is loaded into an image data storage device;
an output device that produces human-viewable image representations of the object from the image data; and,
an automatic ghost reducing means which automatically generates from the image data correction factors that are applied to the raw data for reducing ghosting in the image representations, wherein the correction factors include a phase correction factor and a data alignment correction factor, said phase correction factor compensating for phase errors in the raw data and said data alignment correction factor effectively shifting a data acquisition window under which the raw data is collected to thereby adjust an alignment of the raw data.

21. The MRI scanner according to claim 20, wherein the image data represents an array of pixels having complex intensity values with corresponding magnitudes, and the automatic ghost reducing means includes a summing processor that sums the magnitudes to thereby evaluate an amount of ghosting.

22. The MRI scanner according to claim 21, wherein the automatic ghost reducing means further includes an optimization engine that employs the sum of magnitudes from the summing processor as a cost function in a non-linear optimization to generate the correction factors.

23. The MRI scanner according to claim 22, wherein the automatic ghost reducing means further includes a correction factor storage device from which the generated correction factors are taken for application to the raw data.

24. A magnetic resonance imaging apparatus comprising:
means for applying an EPI pulse sequence with an MRI scanner to induce a detectable magnetic resonance signal from a selected region of a subject positioned in the MRI scanner;
means for receiving and demodulating the magnetic resonance signal to generate raw data;
means for applying a pair of ghost reducing correction factors to the raw data, said pair of corrections factors including a phase correction and an alignment correction, wherein the phase correction compensates for phase errors in the raw data and the alignment correction effectively shifts a data acquisition window under which the raw data was collected to thereby align the raw data with respect to itself in k-space;
means for loading the correction factor affected data into k-space to generate a k-space data matrix;
means for subjecting the k-space data matrix to a reconstruction algorithm to generate actual image data; and,
means for calculating values for the pair of correction factors using the actual image data.

* * * * *